United States Patent
Kawachi et al.

(10) Patent No.: US 9,294,068 B2
(45) Date of Patent: Mar. 22, 2016

(54) FILTER CIRCUIT AND MODULE

(71) Applicant: TAIYO YUDEN CO., LTD., Tokyo (JP)

(72) Inventors: Osamu Kawachi, Tokyo (JP); Kensei Uehara, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 14/447,304

(22) Filed: Jul. 30, 2014

(65) Prior Publication Data

US 2014/0340168 A1 Nov. 20, 2014

Related U.S. Application Data

(63) Continuation of application No. PCT/JP2012/052603, filed on Feb. 6, 2012.

(51) Int. Cl.
*H01P 1/10* (2006.01)
*H03H 7/46* (2006.01)
*H04B 1/18* (2006.01)
*H04B 1/00* (2006.01)
*H04B 1/44* (2006.01)

(52) U.S. Cl.
CPC .............. *H03H 7/468* (2013.01); *H04B 1/006* (2013.01); *H04B 1/0057* (2013.01); *H04B 1/18* (2013.01)

(58) Field of Classification Search
CPC .............. H01P 1/10; H03H 9/64; H04B 1/44
USPC ................. 333/101, 103, 105, 133, 193–196; 455/78, 83
See application file for complete search history.

(56) References Cited

U.S. PATENT DOCUMENTS 5,815,804 A * 9/1998 Newell et al. .................... 455/78
6,713,940 B2 * 3/2004 Takamine ................. 310/313 R (Continued)

FOREIGN PATENT DOCUMENTS

JP    2003-087150 A    3/2003
JP    2003-517239 A    5/2003

(Continued)

OTHER PUBLICATIONS

English translation of Written Opinion (PCT/ISA/237) issued in PCT/JP2012/052603 mailed in Mar. 2012.

(Continued)

*Primary Examiner* — Dean Takaoka
(74) *Attorney, Agent, or Firm* — Chen Yoshimura LLP

(57) ABSTRACT

A filter circuit includes: a first band-pass filter, a second band-pass filter, a third band-pass filter and a fourth band-pass filter each having input and output terminals; a first terminal to which one of input and output terminals of first band-pass filter and one of input and output terminals of second band-pass filter are connected; a second terminal to which one of input and output terminals of third band-pass filter and one of input and output terminals of fourth band-pass filter are connected; a third terminal to which another one of input and output terminals of first band-pass filter and another one of input and output terminals of fourth band-pass filter are connected; and a fourth terminal to which another one of input and output terminals of second band-pass filter and another one of input and output terminals of third band-pass filter are connected.

14 Claims, 6 Drawing Sheets

(56) References Cited

U.S. PATENT DOCUMENTS

| | | | |
|---|---|---|---|
| 6,724,278 B1* | 4/2004 | Smith | 333/133 |
| 7,010,273 B2* | 3/2006 | Satoh et al. | 455/83 |
| 2003/0076194 A1 | 4/2003 | Machui | |
| 2004/0048634 A1 | 3/2004 | Satoh et al. | |
| 2008/0212500 A1* | 9/2008 | Zhen et al. | 370/277 |
| 2009/0153269 A1* | 6/2009 | Ono et al. | 333/193 |
| 2009/0273409 A1* | 11/2009 | Okuda | 333/5 |

FOREIGN PATENT DOCUMENTS

| | | |
|---|---|---|
| JP | 2004-356766 A | 12/2004 |
| JP | 2008-167105 A | 7/2008 |
| JP | 2008-236407 A | 10/2008 |

OTHER PUBLICATIONS

International Search Report (ISR) issued in PCT/JP2012/052603 mailed in Mar. 2012.
Written Opinion (PCT/ISA/237) issued in PCT/JP2012/052603 mailed in Mar. 2012.
Korean Office Action dated Apr. 14, 2015, in a counterpart Korean patent application No. 10-2014-7021725.
Japanese Office Action dated Aug. 25, 2015, in a counterpart Japanese patent application No. 2013-557266.
Korean Office Action dated Oct. 28, 2015, in a counterpart Korean patent application No. 10-2014-7021725.
Japanese Office Action dated Dec. 8, 2015, in a counterpart Japanese patent application No. 2013-557266.

* cited by examiner

US 9,294,068 B2

FILTER CIRCUIT AND MODULE

CROSS-REFERENCE TO RELATED APPLICATION

This application is a continuation application of PCT/JP2012/052603 filed Feb. 6, 2012, the contents of which are herein wholly incorporated by reference.

FIELD

The present invention relates to a filter circuit and a module, e.g. to a filter circuit and a module which have a plurality of band-pass filters.

BACKGROUND

For example, in a mobile communication terminal, a plurality of band-pass filters are used in response to various communication methods. The plurality of band-pass filters are integrated into in a single component as one filter circuit, for example.

Japanese National Publication of International Patent Application No. 2003-517239 discloses forming a duplexer using four band-pass filters. The four band-pass filters are integrated as a single module.

When a single filter circuit is formed using a plurality of filters, each filter includes an input terminal and an output terminal. Therefore, the filter circuit includes many terminals.

SUMMARY OF THE INVENTION

According to an aspect of the present invention, there is provided a filter circuit comprising: a first band-pass filter, a second band-pass filter, a third band-pass filter and a fourth band-pass filter each having an input terminal and an output terminal; a first terminal to which one of the input terminal and the output terminal of the first band-pass filter and one of the input terminal and the output terminal of the second band-pass filter are connected in common; a second terminal to which one of the input terminal and the output terminal of the third band-pass filter and one of the input terminal and the output terminal of the fourth band-pass filter are connected in common; a third terminal to which another one of the input terminal and the output terminal of the first band-pass filter and another one of the input terminal and the output terminal of the fourth band-pass filter are connected in common; and a fourth terminal to which another one of the input terminal and the output terminal of the second band-pass filter and another one of the input terminal and the output terminal of the third band-pass filter are connected in common.

According to another aspect of the present invention, there is provided a module including the above filter circuit.

DETAILED DESCRIPTION

Hereinafter, a description will be given of embodiments of the present invention with reference to drawings.

First Embodiment

Figure 1A:
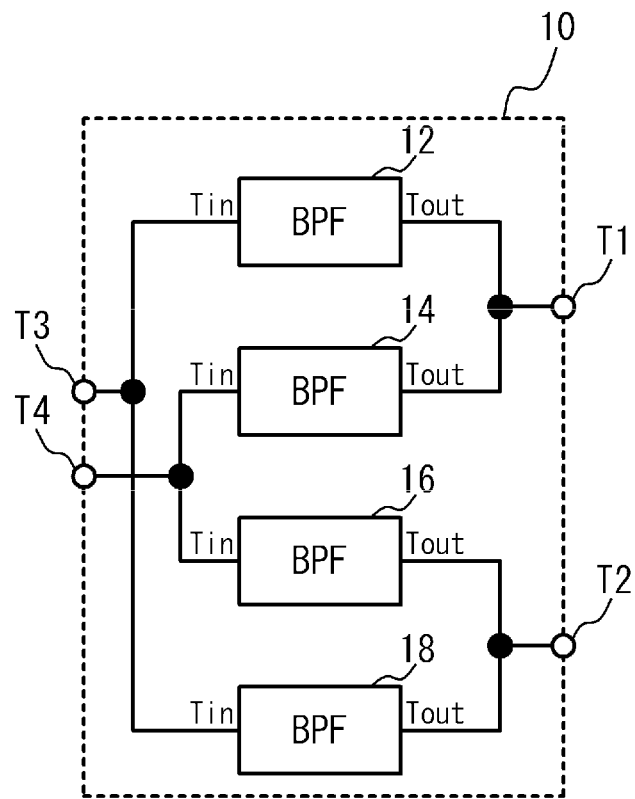
FIG. 1A is a circuit diagram of a filter circuit according to a first embodiment.
Figure 1B:
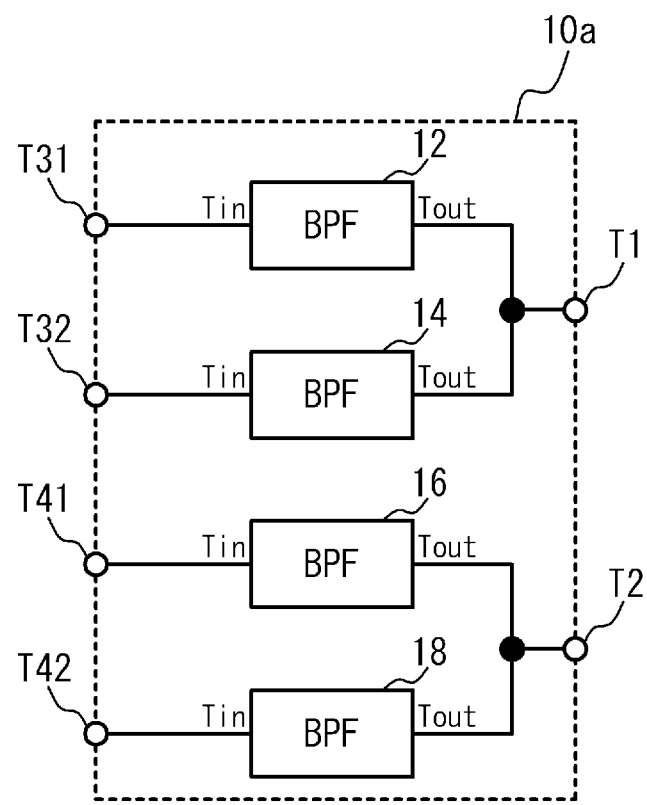
FIG. 1B is a circuit diagram of a filter circuit according to a comparative example.

FIG. 1A is a circuit diagram of a filter circuit according to a first embodiment. FIG. 1B is a circuit diagram of a filter circuit according to a comparative example. With reference to FIG. 1A, a filter circuit 10 according to the first embodiment includes a first BPF (Band-Pass Filter) 12, a second BPF 14, a third BPF 16 and a fourth BPF 18. Each of the BPFs 12 to 18 includes an input terminal Tin and an output terminal Tout. A high frequency signal is inputted to each input terminal Tin. Each of the BPFs 12 to 18 allows a signal in a pass band among the high frequency signal to pass, and suppresses a signal having another frequency. The filtered high frequency signal is outputted from the output terminal Tout. The output terminal Tout of the first BPF 12 and the output terminal Tout of the second BPF 14 are electrically connected in common to the first terminal T1. The output terminal Tout of the third BPF 16 and the output terminal Tout of the fourth BPF 18 are electrically connected in common to the second terminal T2. The input terminal Tin of the first BPF 12 and the input terminal Tin of the fourth BPF 18 are electrically connected in common to the third terminal T3. The input terminal Tin of the second BPF 14 and the input terminal Tin of the third BPF 16 are electrically connected in common to the fourth terminal T4.

With reference to FIG. 1B, in a filter circuit 10a of the comparative example, the output terminal Tout of the first BPF 12 and the output terminal Tout of the second BPF 14 are electrically connected in common to the first terminal T1. The output terminal Tout of the third BPF 16 and the output terminal Tout of the fourth BPF 18 are electrically connected in common to the second terminal T2. However, the input terminals from the first BPF 12 to the fourth BPF 18 are connected to the terminals T31, T32, T41 and T42, respectively.

According to the first embodiment, a number of terminals to/from which the high frequency signal of the filter circuit is inputted or outputted can be reduced, compared with the comparative example. In the filter circuit 10, each of the BPFs 12 to 18 may be mounted in a single package. Each of the BPFs 12 to 18 may be mounted on a single mounting substrate. Each of the BPFs 12 to 18 may be an acoustic wave filter using a surface acoustic wave resonator, a love wave resonator, an acoustic boundary wave resonator or a piezoelectric thin film resonator. The acoustic wave filter may include a ladder type filter or/and a multi-mode type filter. Moreover, each of the BPFs 12 to 18 may be an LC filter.

Figure 2:
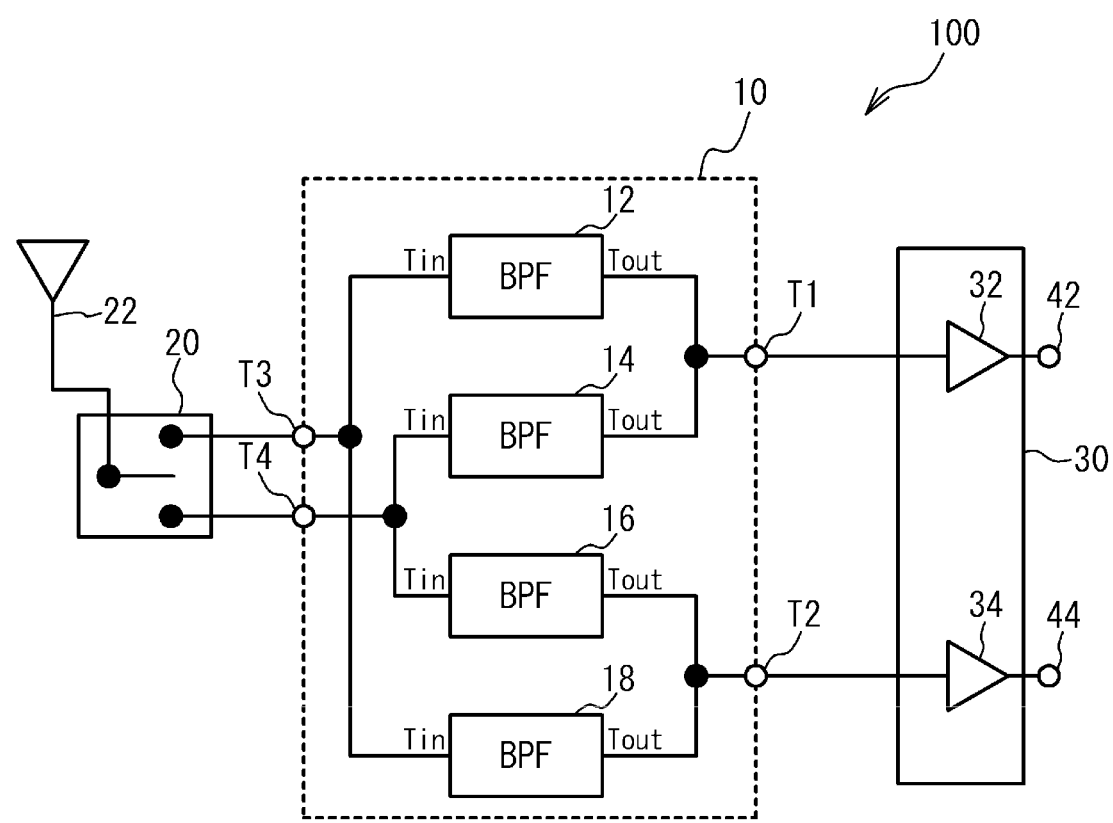
FIG. 2 is a circuit diagram of a reception circuit used for the first embodiment.

A description will be given of an example of a circuit used for the first embodiment. FIG. 2 is a circuit diagram of a reception circuit used for the first embodiment. A reception circuit 100 includes an antenna 22, a switch 20, the filter circuit 10 and an amplifier circuit 30. The amplifier circuit 30 includes low noise amplifiers (LNA) 32 and 34. The pass bands of the BPFs 12 to 18 differ from each other. For example, the pass bands of the BPFs 12 to 18 do not overlap with each other. For example, the first BPF 12 is a reception filter of GSM (registered trademark) (Global System for Mobile Communication) 850 in which the reception band is 869 to 894 MHz. The second BPF 14 is a reception filter of GSM 900 in which the reception band is 925 to 960 MHz. The third BPF 16 is a reception filter of GSM 1800 in which the reception band is 1805 to 1880 MHz. The fourth BPF 18 is a reception filter of GSM 1900 in which the reception band is 1930 to 1990 MHz.

An impedance in the case where the first BPF 12 and the fourth BPF 18 are seen from the third terminal T3 is set so that the first BPF 12 reflects a signal in the pass band of the fourth BPF 18 and allows a signal in the pass band of the first BPF 12 to pass, and the fourth BPF 18 reflects the signal in the pass band of the first BPF 12 and allows the signal in the pass band of the fourth BPF 18 to pass. For example, a matching circuit may be provided between the third terminal T3, and the first BPF 12 and the fourth BPF 18 so that the above-mentioned impedance is set.

Moreover, an impedance in the case where the second BPF 14 and the third BPF 16 are seen from the fourth terminal T4 is set so that the second BPF 14 reflects a signal in the pass band of the third BPF 16 and allows a signal in the pass band of the second BPF 14 to pass, and the third BPF 16 reflects the signal in the pass band of the second BPF 14 and allows the signal in the pass band of the third BPF 16 to pass. For example, a matching circuit may be provided between the fourth terminal T4, and the second BPF 14 and the third BPF 16 so that the above-mentioned impedance is set.

An impedance in the case where the first BPF 12 and the second BPF 14 are seen from the first terminal T1 is set so that the first BPF 12 reflects a signal in the pass band of the second BPF 14 and the second BPF 14 reflects a signal in the pass band of the first BPF 12. For example, a matching circuit may be provided between the first terminal T1, and the first BPF 12 and the second BPF 14 so that the above-mentioned impedance is set.

An impedance in the case where the third BPF 16 and the fourth BPF 18 are seen from the second terminal T2 is set so that the third BPF 16 reflects a signal in the pass band of the fourth BPF 18 and the fourth BPF 18 reflects a signal in the pass band of the third BPF 16. For example, a matching circuit may be provided between the second terminal T2, and the third BPF 16 and the fourth BPF 18 so that the above-mentioned impedance is set.

The switch 20 selects one of the third terminal T3 and the fourth terminal T4, and is electrically connected to the antenna 22. Thereby, a signal received by the antenna 22 is inputted to one of the third terminal T3 and the fourth terminal T4.

The signal in the pass band of the first BPF 12 among signals inputted to the third terminal T3 is outputted from the first terminal T1. The signal in the pass band of the fourth BPF 18 among the signals inputted to the third terminal T3 is outputted from the second terminal T2. Similarly, the signal in the pass band of the second BPF 14 among signals inputted to the fourth terminal T4 is outputted from the first terminal T1. The signal in the pass band of the third BPF 16 among signals inputted to the fourth terminal T4 is outputted from the second terminal T2.

The signal outputted from the first terminal T1 is amplified by the LNA 32, and the amplified signal is outputted from the terminal 42. The signal outputted from the second terminal T2 is amplified by the LNA 34, and the amplified signal is outputted from the terminal 44. It is difficult to achieve an amplifier having a high-performance broadband. For example, the first BPF 12 allows a reception signal of the GSM 850 to pass, and the second BPF 14 allows a reception signal of the GSM 900 to pass. Since the LNA 32 amplifies signals having frequencies close to frequencies of the reception signals of the GSM 850 and the GSM 900, it is sufficient that the number of LNAs 32 corresponding to the first BPF 12 and the second BPF 14 is one. Thereby, the output terminals Tout of the first BPF 12 and the second BPF 14 can be commonalized. Similarly, since the LNA 34 amplifies signals having frequencies close to frequencies of the reception signals of the GSM 1800 and the GSM 1900, it is sufficient that the number of LNAs 34 corresponding to the third BPF 16 and the fourth BPF 18 is one. Thereby, the output terminals Tout of the third BPF 16 and the fourth BPF 18 can be commonalized.

According to the first embodiment, the pass bands of the first BPF 12 and the second BPF 14 are lower than those of the third BPF 16 and the fourth BPF 18. Thereby, a signal which passes through the BPF having a pass band close to a certain pass band can be amplified by the same LNA. Therefore, the LNA can be shared without using a broadband amplifier. On the other hand, the input terminals Tin of the first BPF 12 and the fourth BPF 18 which have pass bands in which a frequency difference between the pass bands is comparatively large are electrically connected to the third terminal T3. The input terminals Tin of the second BPF 14 and the third BPF 16 which have pass bands in which a frequency difference between the pass bands is comparatively large are electrically connected to the fourth terminal T4. Thereby, when the switch 20 outputs a signal from the antenna 22 to the third terminal T3, the reception signal of the GSM 850 is amplified and outputted from the terminal 42, and the reception signal of the GSM 1900 is amplified and outputted from the terminal 44. On the other hand, when the switch 20 outputs a signal from the antenna 22 to the fourth terminal T4, the reception signal of the GSM 900 is amplified and outputted from the terminal 42, and the reception signal of the GSM 1800 is amplified and outputted from the terminal 44. Thus, the filter circuit 10 can reduce the number of terminals to/from which the high frequency signal is inputted or outputted, compared with the comparative example.

Moreover, the GSM 850 and the GSM 1900 are communication methods which are mainly used in the United States. The GSM 900 and the GSM 1800 are communication methods which are mainly used in Europe. The BPFs for the communication method used in the same area are connected to the third terminal T3 and the fourth terminal T4, respectively. When the reception circuit 100 is used in the United States, for example, the switch 20 selects the third terminal T3. Thereby, the reception signals of the communication method which is used in the United States are simultaneously outputted to the terminals 42 and 44. When the reception circuit 100 is used in Europe, for example, the switch 20 selects the fourth terminal T4. Thereby, the reception signals of the communication method which is used in Europe are simultaneously outputted to the terminals 42 and 44.

Second Embodiment

Figure 3:
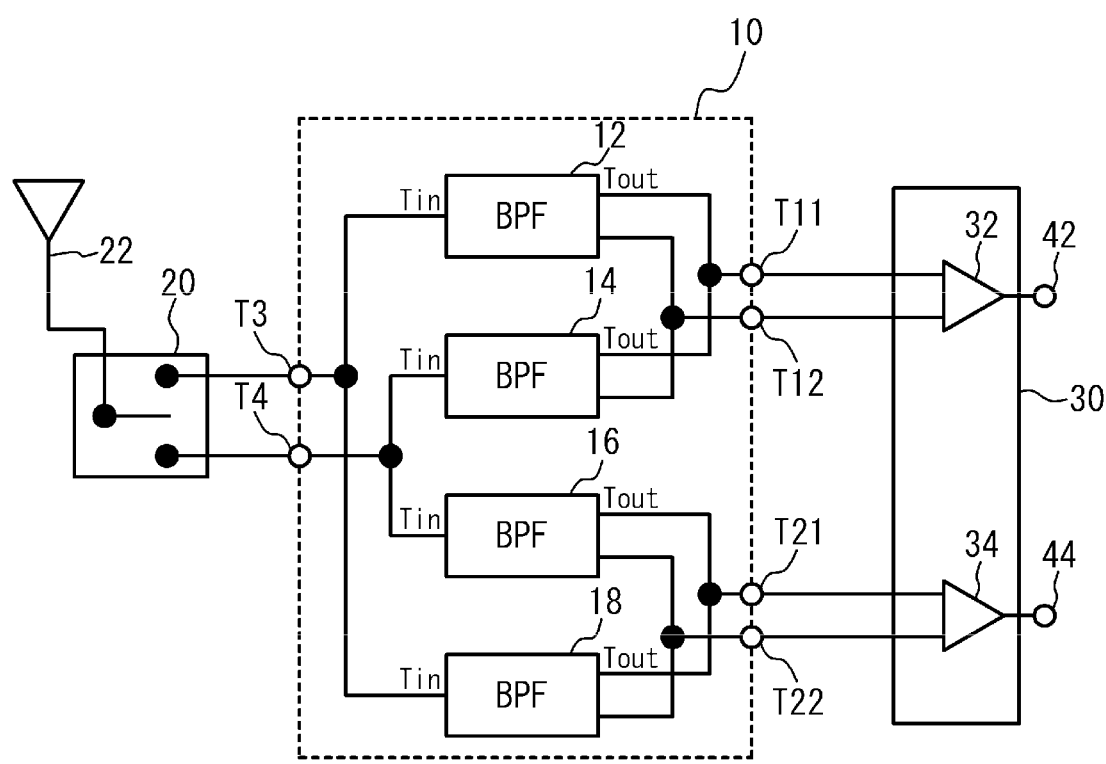
FIG. 3 is a circuit diagram of a reception circuit used for a second embodiment.

A second embodiment is an example that the output terminal of each BPF is a balanced output. FIG. 3 is a circuit diagram of a reception circuit used for the second embodiment. Compared with FIG. 2, the output terminal Tout of each of the BPFs 12 to 18 is a balanced output. A balanced signal is inputted to each of the LNAs 32 and 34. Therefore, two first terminals T11 and T12, and two second terminals T21 and T22 are provided. Other elements are the same as corresponding elements of FIG. 2, and a description thereof is omitted. As described in the second embodiment, the first terminals T11 and T12 and the second terminals T21 and T22 may be balanced terminals, respectively. That is, at least one of the first terminal and the second terminal may be a balanced terminal. Moreover, the input terminal Tin of each of the BPFs 12 to 18 may be a balanced input and be composed of a plurality of terminals. In this case, each of the third terminal T3 and the fourth terminal T4 is composed of two terminals. Thus, each of the first terminal, the second terminal, the third terminal and the fourth terminal may be composed of a plurality of terminals.

Third Embodiment

Figure 4:
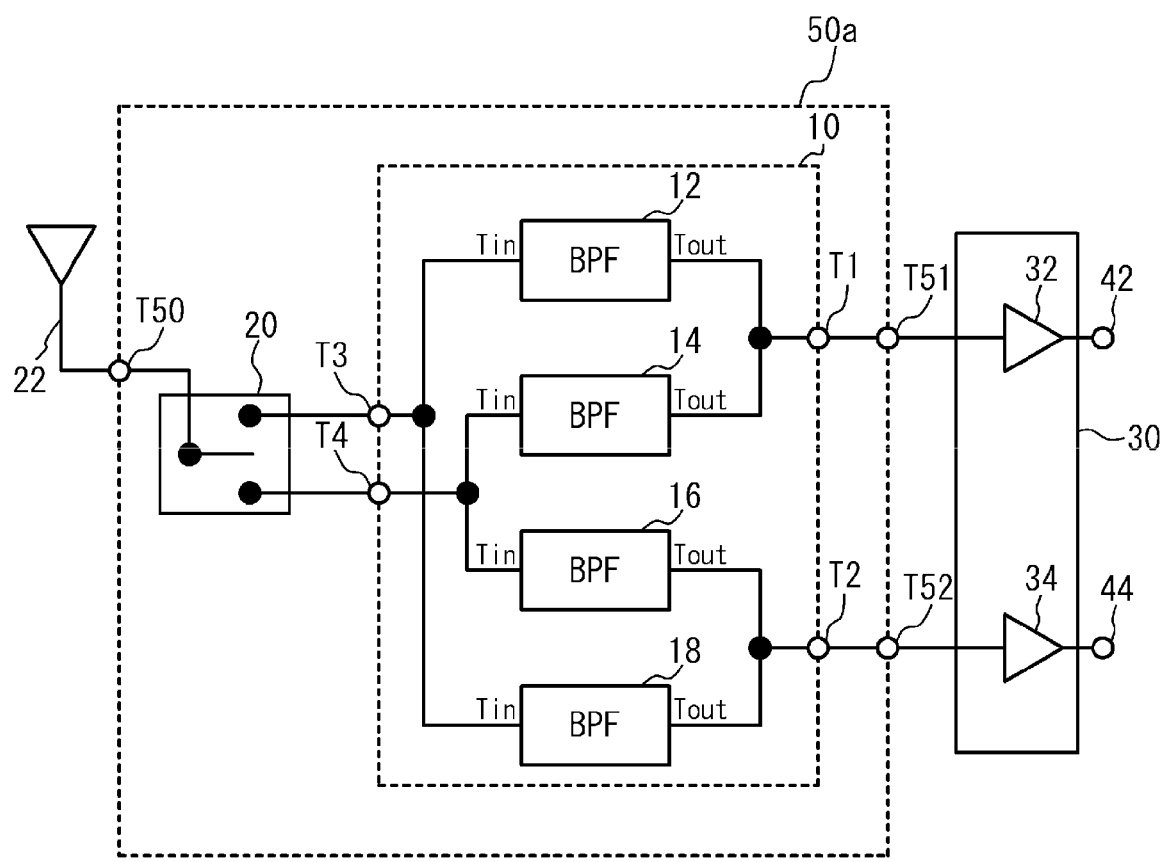
FIG. 4 is a circuit diagram of a module and circumference thereof according to a third embodiment.

A third embodiment is an example of a module including the filter circuit according to the first and the second embodiments. FIG. 4 is a circuit diagram of a module and circumference thereof according to the third embodiment. As illustrated in FIG. 4, a module 50a includes the switch 20, and the filter circuit 10 of the first or second embodiment. In the module 50a, the switch 20 and the filter circuit 10 are mounted on a wiring substrate or the like, for example. The module 50a includes a terminal T50 to be connected to the switch 20, a terminal T51 to be connected to the first terminal T1, and a terminal T52 to be connected to the second terminal T2. Other elements are the same as corresponding elements of FIG. 2 in the first embodiment, and a description thereof is omitted.

Figure 5:
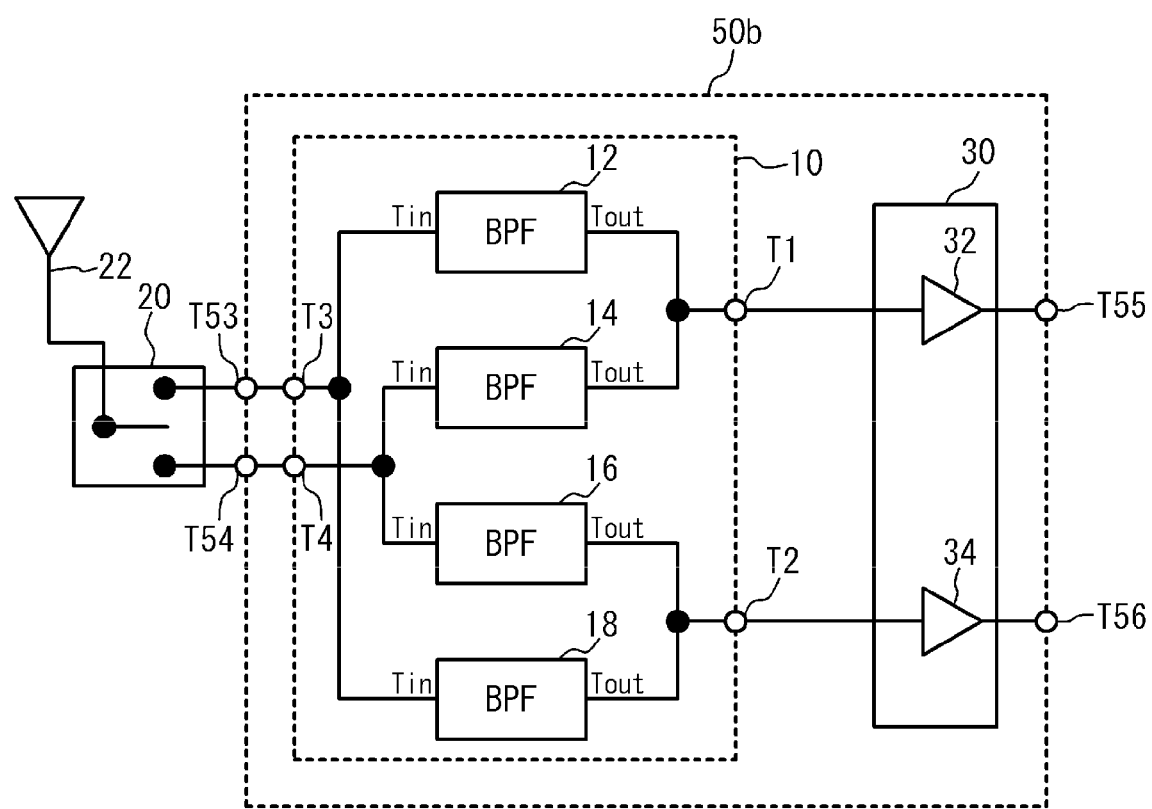
FIG. 5 is a circuit diagram of a module and circumference thereof according to a first variation of the third embodiment.

FIG. 5 is a circuit diagram of a module and circumference thereof according to a first variation of the third embodiment. As illustrated in FIG. 5, a module 50b includes the amplifier circuit 30, and the filter circuit 10 of the first or second embodiment. In the module 50b, the amplifier circuit 30 and the filter circuit 10 are mounted on a wiring substrate or the like, for example. The module 50b includes a terminal T53 to be electrically connected to the third terminal T3, a terminal T54 to be electrically connected to the fourth terminal T4, a terminal T55 to be electrically connected to the output of the LNA 32, and a terminal T56 to be electrically connected to the output of the LNA 34. Other elements are the same as corresponding elements of FIG. 2 in the first embodiment, and a description thereof is omitted.

Figure 6:
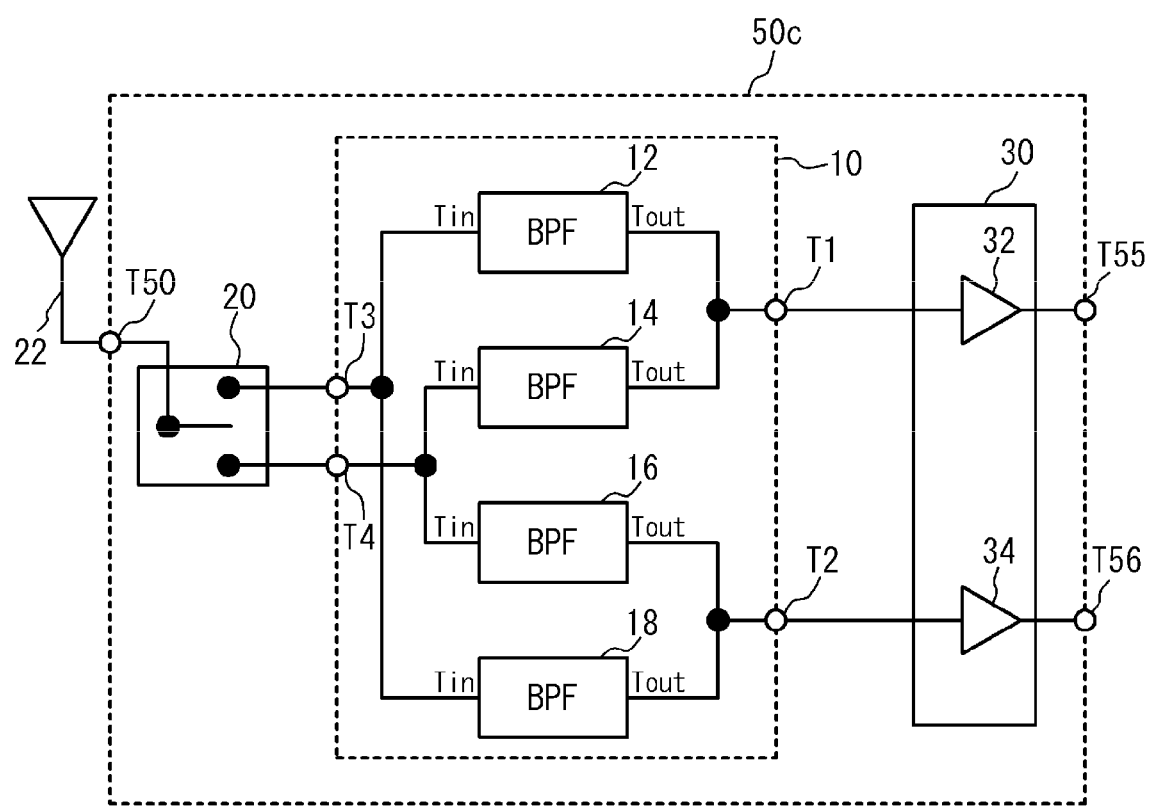
FIG. 6 is a circuit diagram of a module and circumference thereof according to a second variation of the third embodiment.

FIG. 6 is a circuit diagram of a module and circumference thereof according to a second variation of the third embodiment. As illustrated in FIG. 6, a module 50C includes the switch 20, the amplifier circuit 30, and the filter circuit 10 of the first or second embodiment. In the module 50c, the switch 20, the amplifier circuit 30 and the filter circuit 10 are mounted on a wiring substrate or the like, for example. The module 50c includes the terminal T50 to be electrically connected to the switch 20, a terminal T55 to be electrically connected to the output of the LNA 32 and a terminal T56 to be electrically connected to the output of the LNA 34. Other elements are the same as corresponding elements of FIG. 2 in the first embodiment, and a description thereof is omitted.

As described in the third embodiment and the variations, the module may include the filter circuit 10 of the first or second embodiment.

In the first to the third embodiments, the description has be given of an example in which the first terminal T1 and the second terminal T2 are connected to the output terminals Tout of the BPFs 12 to 18, and the third terminal T3 and the fourth terminal T4 are connected to the input terminals Tin of the BPFs 12 to 18. The first terminal T1 and the second terminal T2 may be connected to the input terminals Tin of the BPFs 12 to 18. The third terminal T3 and the fourth terminal T4 may be connected to the output terminals Tout of the BPFs 12 to 18. In this case, a transmission signal amplified by a power amplifier (PA) is inputted to the first terminal T1. Moreover, a transmission signal amplified by another power amplifier is inputted to the second terminal T2.

Thus, any one of the input terminal Tin and the output terminal Tout of each of the BPFs 12 to 18 should just be connected to the first terminal T1 or the second terminal T2, and another one of the input terminal Tin and the output terminal Tout should just be connected to the third terminal T3 or the fourth terminal T4. A first amplifier (the LNA or the PA) should just be connected to the first terminal T1, and a second amplifier (the LNA or the PA) should just be connected to the second terminal T2.

Although the embodiments of the present invention have been described in detail, it should be understood that the present invention is not limited to these specific embodiments, and the various change, substitutions, and alterations could be made hereto without departing from the spirit and scope of the invention.

What is claimed is:

1. A filter circuit comprising:
 a first band-pass filter, a second band-pass filter, a third band-pass filter and a fourth band-pass filter each having an input terminal and an output terminal;
 a first terminal to which the output terminal of the first band-pass filter and the output terminal of the second band-pass filter are connected in common;
 a second terminal to which the output terminal of the third band-pass filter and the output terminal of the fourth band-pass filter are connected in common;
 a third terminal to which the input terminal of the first band-pass filter and the input terminal of the fourth band-pass filter are connected in common; and
 a fourth terminal to which the input terminal of the second band-pass filter and the input terminal of the third band-pass filter are connected in common,
 wherein whole pass bands of the first band-pass filter, the second band-pass filter, the third band-pass filter and the fourth band-pass filter differ from each other.

2. The filter circuit according to claim 1, wherein the pass bands of the first band-pass filter and the second band-pass filter are lower than the pass bands of the third band-pass filter and the fourth band-pass filter.

3. The filter circuit according to claim 2, wherein the first terminal is a terminal to be connected to a first amplifier, the second terminal is a terminal to be connected to a second amplifier, and the third terminal and the fourth terminal are terminals to which a switch is connected, the switch selecting one of the third terminal and the fourth terminal and connecting the selected one of the third terminal and the fourth terminal to an antenna.

4. A module comprising:
 a filter circuit according to claim 2; and
 a switch that selects any one of the third terminal and the fourth terminal and connect the selected one of the third terminal and the fourth terminal to an antenna.

5. A module comprising:
 a filter circuit according to claim 2;
 a first amplifier connected to the first terminal; and
 a second amplifier connected to the second terminal.

6. A module comprising:
 a filter circuit according to claim 2;
 a switch that selects any one of the third terminal and the fourth terminal and connect the selected one of the third terminal and the fourth terminal to an antenna;
 a first amplifier connected to the first terminal; and
 a second amplifier connected to the second terminal.

7. The filter circuit according to claim 1, wherein at least one of the first terminal and the second terminal includes a pair of balanced terminals.

8. A module comprising:
a filter circuit according to claim 1.

9. The filter circuit according to claim 1, wherein at least one of the first terminal and the second terminal includes an unbalanced terminal.

10. The filter circuit according to claim 9, wherein each of the third terminal and the fourth terminal includes an unbalanced terminal.

11. A filter circuit comprising:
a first band-pass filter, a second band-pass filter, a third band-pass filter and a fourth band-pass filter each having an input terminal and an output terminal;
a first terminal to which the input terminal of the first band-pass filter and the input terminal of the second band-pass filter are connected in common;
a second terminal to which the input terminal of the third band-pass filter and the input terminal of the fourth band-pass filter are connected in common;
a third terminal to which the output terminal of the first band-pass filter and output terminal of the fourth band-pass filter are connected in common; and
a fourth terminal to which the output terminal of the second band-pass filter and the output terminal of the third band-pass filter are connected in common,
wherein whole pass bands of the first band-pass filter, the second band-pass filter, the third band-pass filter and the fourth band-pass filter differ from each other.

12. The filter circuit according to claim 11, wherein the pass bands of the first band-pass filter and the second band-pass filter are lower than the pass bands of the third band-pass filter and the fourth band-pass filter.

13. The filter circuit according to claim 12, wherein the first terminal is a terminal to be connected to a first amplifier, the second terminal is a terminal to be connected to a second amplifier, and the third terminal and the fourth terminal are terminals to which a switch is connected, the switch selecting one of the third terminal and the fourth terminal and connecting the selected one of the third terminal and the fourth terminal to an antenna.

14. A module comprising:
a filter circuit according to claim 11.

* * * * *